United States Patent
Huang et al.

(10) Patent No.: US 8,536,590 B2
(45) Date of Patent: Sep. 17, 2013

(54) LIGHT EMITTING ELEMENT PACKAGE

(75) Inventors: Shih-Cheng Huang, Hukou (TW); Po-Min Tu, Hukou (TW); Shun-Kuei Yang, Hukou (TW); Chia-Hung Huang, Hukou (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 114 days.

(21) Appl. No.: 13/113,082

(22) Filed: May 23, 2011

(65) Prior Publication Data

US 2011/0291121 A1    Dec. 1, 2011

(30) Foreign Application Priority Data

Jun. 1, 2010    (CN) .......................... 2010 1 0188627

(51) Int. Cl.
*H01L 29/18*    (2006.01)
(52) U.S. Cl.
USPC ............................................ 257/88; 257/98
(58) Field of Classification Search
USPC ..................................... 257/88, 98
See application file for complete search history.

(56) References Cited

U.S. PATENT DOCUMENTS

| 7,582,911 | B2 * | 9/2009 | Lynch et al. | .................... 257/88 |
| 2006/0163589 | A1 | 7/2006 | Fan et al. | |
| 2008/0179603 | A1 | 7/2008 | Sakai et al. | |

FOREIGN PATENT DOCUMENTS

| CN | 1679177 A | 10/2005 |
| CN | 1828921 A | 9/2006 |
| TW | M270492 U | 7/2005 |
| TW | 200642528 A | 12/2006 |

* cited by examiner

*Primary Examiner* — Douglas Menz
(74) *Attorney, Agent, or Firm* — Altis Law Group, Inc.

(57) ABSTRACT

A light emitting element package includes a substrate, at least two light emitting element modules and an encapsulation member. The substrate includes a circuit layer. The circuit layer includes a plurality of solder pads. The at least two light emitting element modules are mounted on the substrate. Each of the at least two light emitting element modules includes a plurality of light emitting elements. Each light emitting element of the at least two light emitting element modules is electrically coupled to neighboring light emitting element in serial through the solder pads. The at least two light emitting element modules are reversely arranged. The encapsulation member is configured to encapsulate the at least two light emitting element modules on the substrate.

11 Claims, 7 Drawing Sheets

LIGHT EMITTING ELEMENT PACKAGE

BACKGROUND

1. Technical Field

The disclosure relates generally to light emitting elements, and more particularly to a light emitting element powered by an AC source.

2. Description of the Related Art

Light emitting elements are often driven by a DC source. However, the drive circuit of the light emitting element is not cost-effective.

Therefore, there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout two views.

DETAILED DESCRIPTION

The disclosure is illustrated by way of example and not by way of limitation in the figures of the accompanying drawings. It should be noted that references to "an" or "one" embodiment in this disclosure are not necessarily to the same embodiment, and such references mean at least one.

Figure 1:
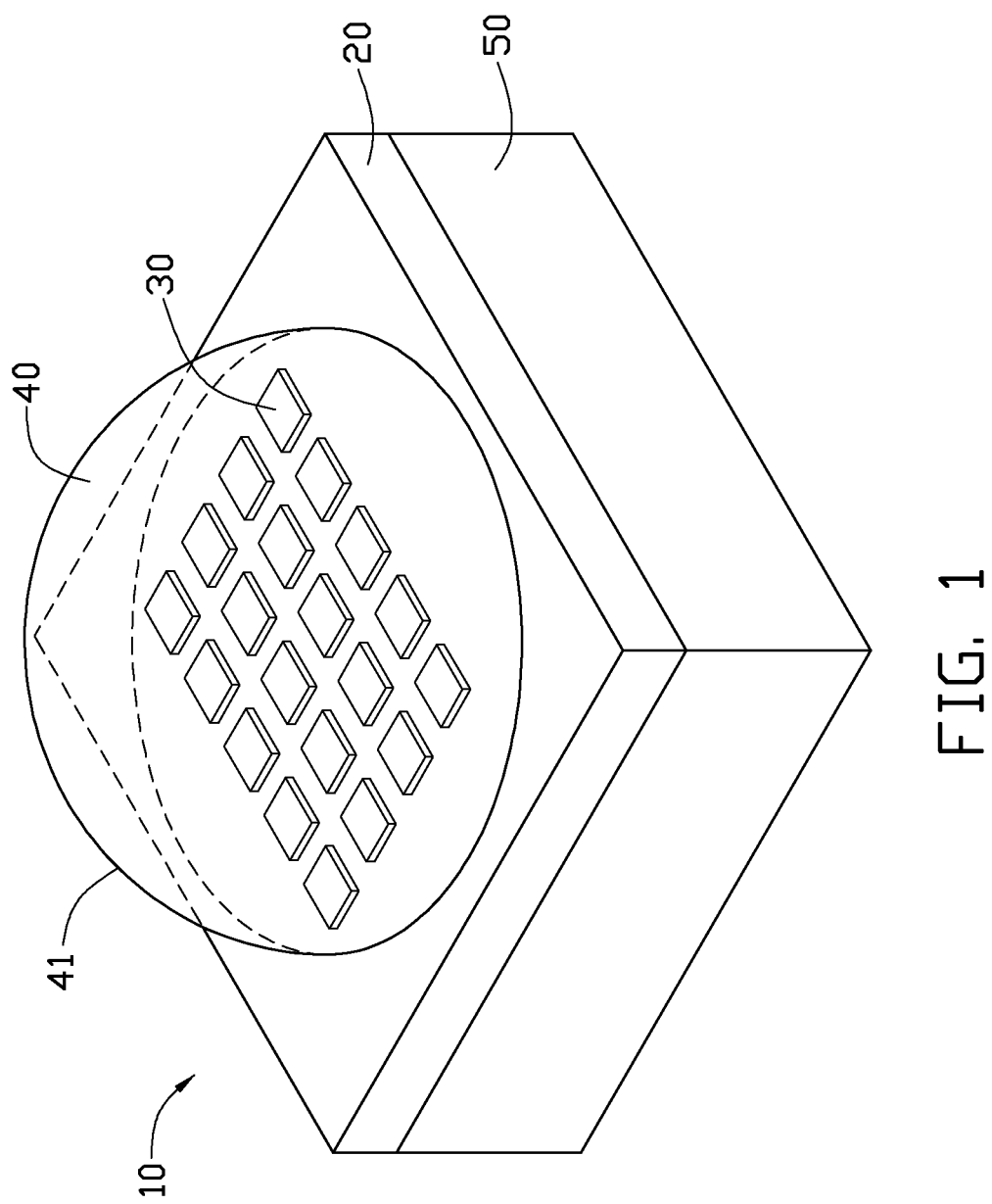
FIG. 1 is an isometric view of a light emitting element package in accordance with a first embodiment of the disclosure.
Figure 2:
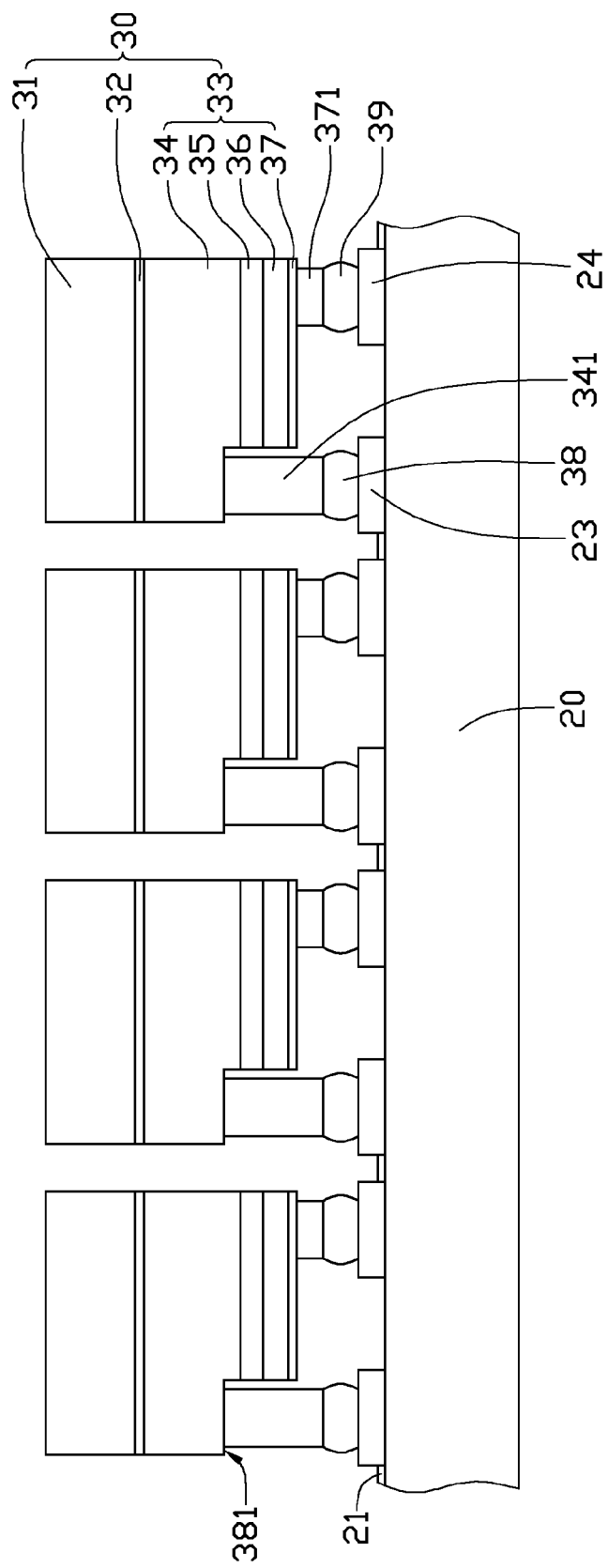
FIG. 2 is a cross-section of the light emitting element package in FIG. 1
Figure 3:
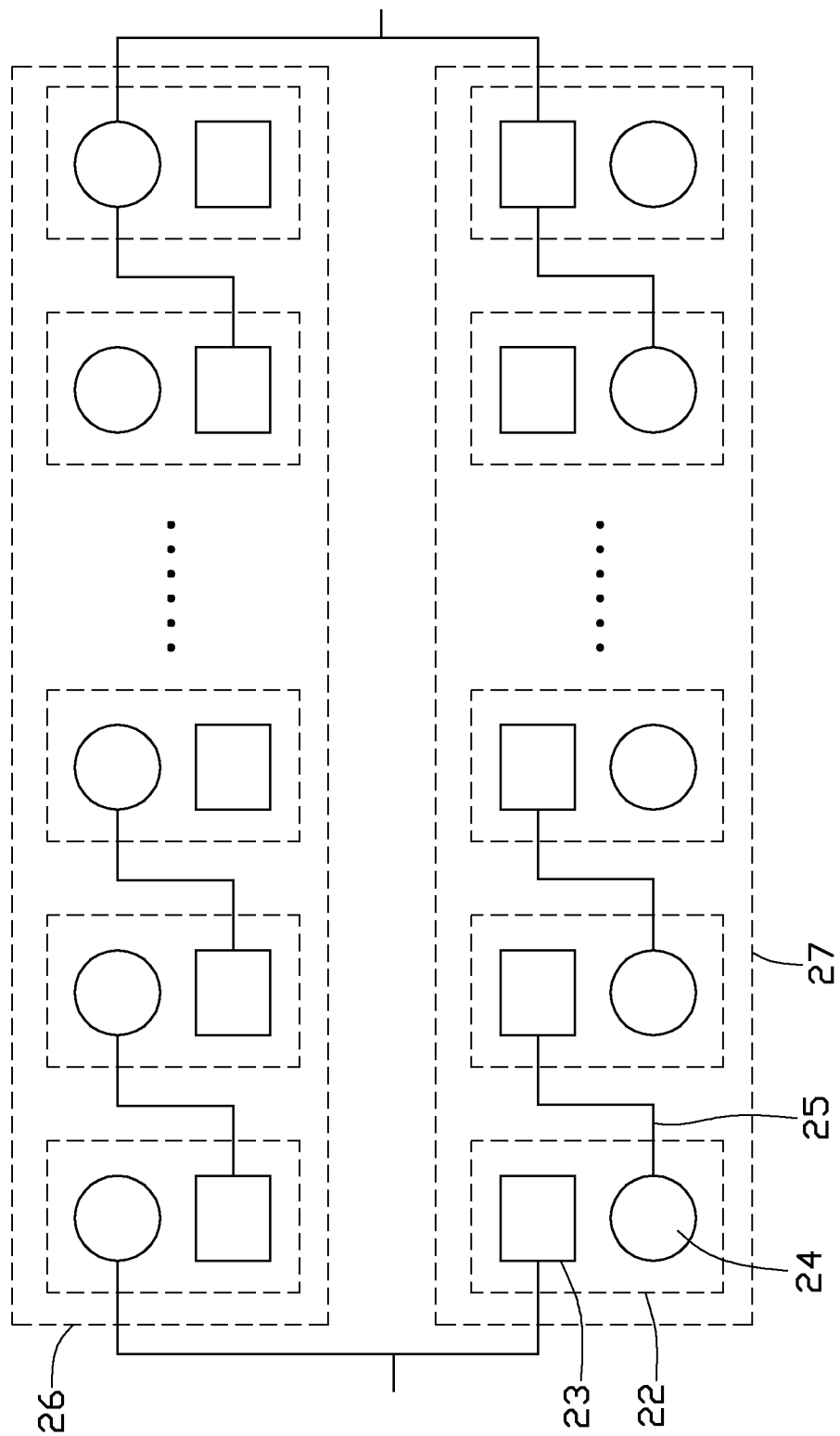
FIG. 3 is schematic view of solder pads of a substrate of the light emitting element package in FIG. 1.

Referring to FIGS. 1-3, a light emitting element package 10 in accordance with a first embodiment of the disclosure includes a substrate 20, a plurality of light emitting elements 30, an encapsulation member 40 and a heat dissipation substrate 50.

The light emitting elements 30 are mounted on one surface of the substrate 20. The encapsulation member 40 is configured for encapsulating the light emitting elements 30 on the substrate 20. The heat dissipation substrate 50 is mounted on a surface of the substrate 20 opposite to that on which the light emitting elements 30 are mounted. The heat dissipation substrate 50 is configured for dissipating heat generated by the light emitting elements 30.

Each of the light emitting elements 30 includes an extension substrate 31, a buffer layer 32 and a multi-layer epitaxial structure 33.

The extension substrate 31 can be sapphire, SiC, Si, GaAs, LiAlO2, MgO, ZnO, GaN, AN or InN.

The multi-layer epitaxial structure 33 includes an N-type semi-conductive layer 34 formed on the buffer layer 32, a semiconductor active layer 35, a P-type semi-conductive layer 36 and a transparent electrode layer 37. The multi-layer epitaxial structure 33 is formed in a mesa pattern. An N-type electrode 341 is formed on a surface 381 of the N-type semiconductive layer 34. A P-type electrode 371 is formed on the transparent electrode layer 37.

A circuit layer 21 is formed on the substrate 20, and includes a plurality of solder pad modules 22. Each of the solder pad modules 22 includes an N-type solder pad 23 and a P-type solder pad 24. The N-type solder pad 23 of each solder pad module 22 is electrically coupled to the P-type solder pad 24 of the neighboring solder pad module 22 by a connection metal 25. The N-type solder pad 23 and the P-type solder pad 24 of the solder pad module 22 are respectively coupled to the N-type electrode 341 and the P-type electrode 371 of the light emitting element 30.

The light emitting element 30 is electrically coupled to the N-type solder pad 23 and the P-type solder pad 24 through the N-type electrode 341 and the P-type electrode 371. Thus, the light emitting elements 30 are mounted on the substrate 20 as a flip chip package.

Optimally, an N-type connection material 38 is arranged between the N-type electrode 341 and the N-type solder pad 23. A P-type connection material 39 is arranged between the N-type electrode 371 and the N-type solder pad 24.

The encapsulation member 40 is mounted on the substrate 20 to encapsulate the light emitting elements 30 and the connection metals 25. An exterior surface of the encapsulation member 40 can be flat, concave or convex. In the first embodiment, the exterior surface is convex. The encapsulation member 40 is epoxy, silicone or a combination thereof.

The encapsulation member 40 can also include a plurality of light diffusion agents. The light diffusion agent can be $SiO_2$ series light diffusion agent, $TiO_2$ series light diffusion agent or $CaCO_3$ series light diffusion agents, configured for increasing diffusion and transmission of light-emitting element 30 to increase the illumination efficiency of the light-emitting element package 10. The encapsulation can also include phosphor elements. The phosphor elements can be YAG, TAG, silicate, nitride, nitrogen oxide, phosphide, sulfide or a combination thereof.

Figure 4:
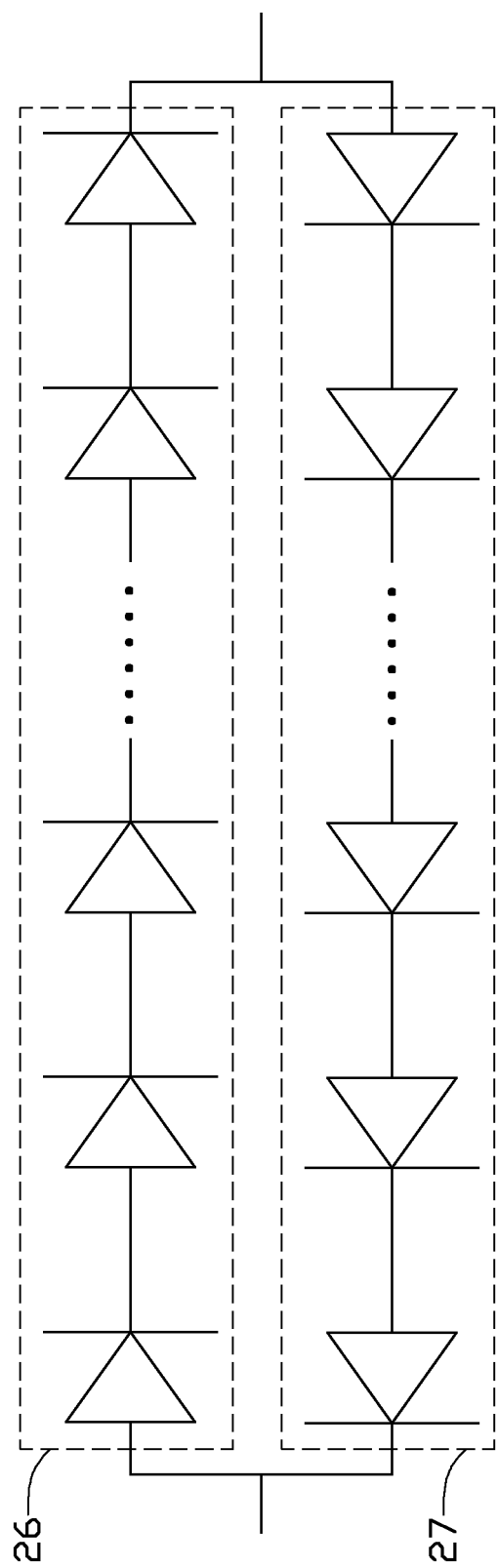
FIG. 4 is an equivalent circuit diagram of the light emitting element package in FIG. 3.

Referring to FIG. 4, a first light emitting element module 26 and a second light emitting element module 27 are arranged on the substrate 20. The light emitting elements of the first light emitting element module are connected in serial. The light emitting elements of the second light emitting element module 27 are connected in serial.

In the first embodiment, the number of light emitting elements of the first light emitting element module 26 equals that of the second light emitting element module 27, such that total working voltage of the first light emitting element module 26 equals that of the second light emitting element module 27. The first light emitting element module 26 and the second light emitting element module 27 are connected in parallel and arranged reversely.

Thus, the first light emitting element module 26 and the second light emitting element module 27 can be driven by an AC source (not shown). To ensure that the light emitting elements of the first light emitting element module 26 and the second light emitting element module 27 can work in a rated voltage, the sum of the working voltage of the light emitting elements of the first light emitting element module 26 and the second light emitting element module 27 equals the peak voltage of the AC source.

When the first light emitting element module 26 and the second light emitting element module 27 are driven by an AC source, one of the first light emitting element module 26 and the second light emitting module 27 can be turned on in a positive half cycle of the AC source. In a negative half cycle of the AC source, the other can be turned on.

Figure 5:
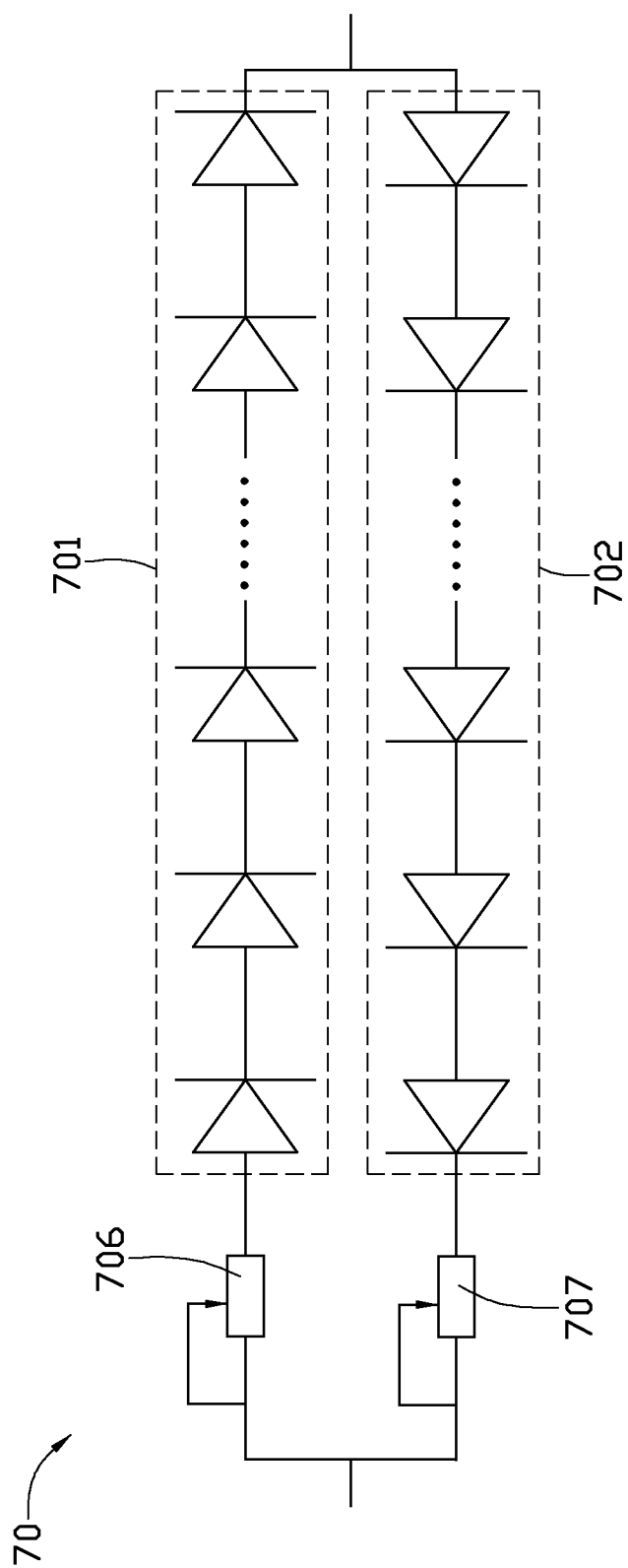
FIG. 5 is an equivalent circuit diagram of a light emitting element package in accordance with a second embodiment of the disclosure.

Referring to FIG. 5, a light emitting element package 70 in accordance with a second embodiment of the disclosure differs from the light emitting element package 10 of the first embodiment only in that the light emitting element package 70 includes a first variable resister 706 and a second variable resister 707, the first variable resister 706 serially connected to the first light emitting element module 701 and the second variable resister 707 is serially connected to the first light emitting element module 702. Thus, the number of light emitting elements of the first light emitting element module 701 can be different from that of the second light emitting element module 702. The first variable resister 706 and the second variable resister 707 ensure that the light emitting elements of first light emitting element module 701 and the second light emitting element module 702 work in a rated voltage.

Figure 6:
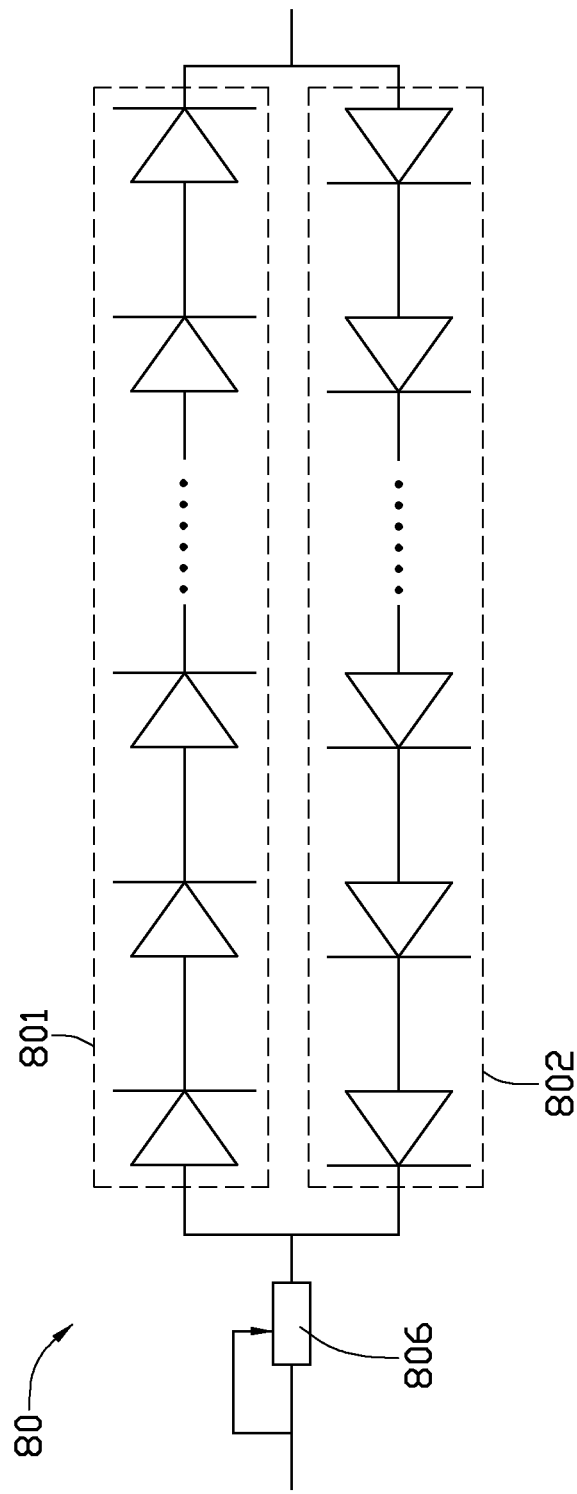
FIG. 6 is an equivalent circuit diagram of a light emitting element package in accordance with a third embodiment of the disclosure.

Referring to FIG. 6, a light emitting element package 80 in accordance with a third embodiment of the disclosure differs from the light emitting element package 70 only in that the light emitting element 80 includes only a third variable resister 806. The first light emitting element module 801 and the second light emitting element module 802 are connected in parallel. The third variable resister 806 is serially connected to the first light emitting element module 801 and the second light emitting element module 802.

Figure 7:
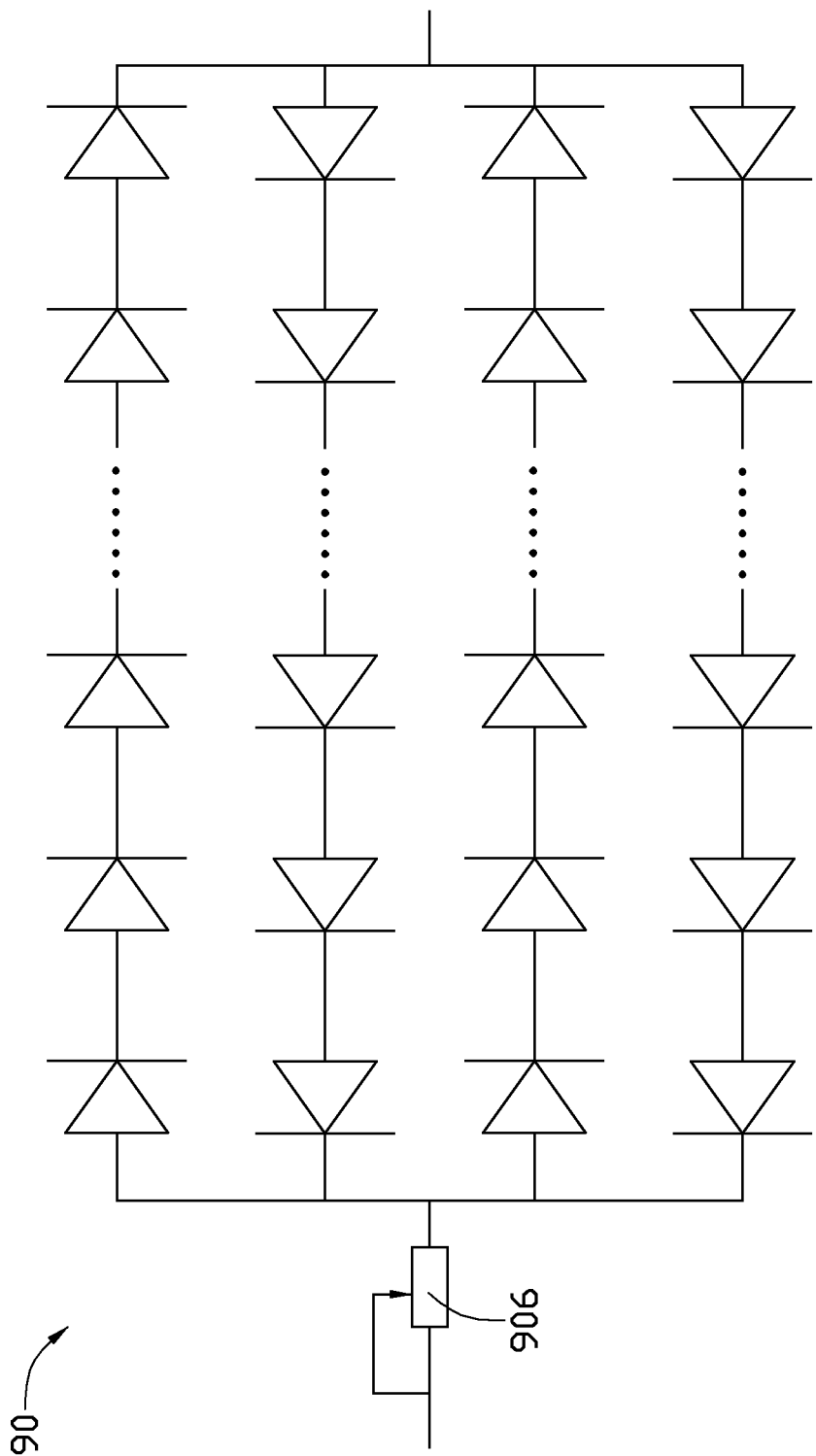
FIG. 7 is an equivalent circuit diagram of a light emitting element package in accordance with a fourth embodiment of the disclosure.

Referring to FIG. 7, a light emitting element package 90 in accordance with a fourth embodiment of the disclosure differs from light emitting element package 80 only in that the light emitting element package includes four light emitting element modules coupled to a fourth variable resister 906.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting element package comprising:
a substrate comprising a circuit layer, the circuit layer comprising a plurality of solder pads;
at least two light emitting element modules mounted on the substrate, each of the at least two light emitting element modules comprising a plurality of light emitting elements, each of the light emitting elements being a chip and comprising an extension substrate, and a buffer layer and a multi-layer epitaxial structure successively arranged on the extension substrate, the extension substrates being single crystal substrates and independent from each other, the light emitting elements of each of the at least two light emitting element modules electrically coupled with each other in series through corresponding solder pads, the at least two light emitting element modules reversely arranged and connected in parallel; and
an encapsulation member configured for encapsulating the at least two light emitting element modules on the substrate.

2. The light emitting element package of claim 1, further comprising a variable resister electrically coupled to one of the at least two light emitting element modules in series.

3. The light emitting element package of claim 1, further comprising a variable resister electrically coupled to the at least two light emitting element modules in serial.

4. The light emitting element package of claim 1, further comprising at least two variable resisters, each of the at least two variable resisters respectively coupled to the at least two light emitting element modules in series.

5. The light emitting element package of claim 1, wherein number of the light emitting elements of each light emitting element module is equal.

6. The light emitting element package of claim 4, wherein the number of light emitting elements of each light emitting element module is different.

7. The light emitting element package of claim 1, further comprising a heat dissipation substrate mounted on a surface of the substrate opposite to a surface that the light emitting elements are mounted on.

8. A light emitting element package comprising:
a substrate comprising a circuit layer, the circuit layer comprising a plurality of solder pads;
a plurality of light emitting element modules mounted on the substrate, each of the light emitting element modules comprising a plurality of light emitting elements and a variable resister, each of the light emitting elements being a chip and comprising an extension substrate, and a buffer layer and a multi-layer epitaxial structure successively arranged on the extension substrate, the extension substrates being single crystal substrates and independent from each other, the light emitting elements of each light emitting element module and the variable resister electrically coupled in series through corresponding solder pads, at least one of the light emitting element modules arranged reversely relative to at least another one of the light emitting element modules; and
an encapsulation member configured for encapsulating the light emitting element modules on the substrate.

9. The light emitting element package of claim 8, wherein the number of light emitting elements of each of the light emitting element modules is equal.

10. The light emitting element package of claim 8, wherein the number of light emitting elements of each of the light emitting element modules is different.

11. The light emitting element package of claim 8, further comprising a heat dissipation substrate mounted on a surface of the substrate opposite to a surface that the light emitting elements are mounted on.

* * * * *